United States Patent [19]
Hopkins

[11] Patent Number: 5,633,639
[45] Date of Patent: May 27, 1997

[54] SUCCESSIVE APPROXIMATION ANALOG TO DIGITAL CONVERTER WITH AUTOMATIC OFFSET

[75] Inventor: Thomas L. Hopkins, Mundelein, Ill.

[73] Assignee: SGS-Thomson Microelectronics, Inc., Carrollton, Tex.

[21] Appl. No.: 346,779

[22] Filed: Nov. 30, 1994

[51] Int. Cl.$^6$ .................................................. H03M 1/06
[52] U.S. Cl. ............................ 341/161; 341/118; 341/120
[58] Field of Search ................................ 341/118, 119, 341/120, 161, 162, 163

[56] References Cited

U.S. PATENT DOCUMENTS

| | | | |
|---|---|---|---|
| 3,982,241 | 9/1976 | Lipcon | 340/347 |
| 4,621,254 | 11/1986 | Belcher | 340/347 |
| 4,647,907 | 3/1987 | Storey | 340/347 |
| 4,649,371 | 3/1987 | Kolluri | 340/347 |
| 4,703,310 | 10/1987 | Van De Plassche | 340/347 |
| 4,761,636 | 8/1988 | Brokaw et al. | 340/347 |
| 4,891,664 | 1/1990 | Noro | 341/128 |
| 4,967,197 | 10/1990 | Peng | 341/118 |
| 5,172,115 | 12/1992 | Kerth et al. | 341/118 |
| 5,194,865 | 3/1993 | Mason et al. | 341/132 |

*Primary Examiner*—Jeffrey A. Gaffin
*Assistant Examiner*—Jason H. Vick
*Attorney, Agent, or Firm*—Theodore E. Galanthay; Lisa K. Jorgenson; Renee M. Larson

[57] ABSTRACT

According to the present invention, a modification of standard successive approximation analog to digital converter circuitry may be utilized to measure an unknown analog value and to produce a digital value after conversion that automatically contains an offset value with respect to a given measurement range. The offset achieved by the successive approximation A/D converter is proportional to an external reference which is used as the reference for the successive approximation A/D converter. The digital value produced according to the present invention is not representative of a raw measurement value but rather is representative of a value with respect to a given measurement range; thus, a digital value of 0 may indicate the minimum value of a given measurement range rather than a value of 0 Ohms, 0 volts, or 0 Amps. This may be expressed in equation form where the desired conversion value is represented by:

$$k(X_{unknown} - X_{offset})$$

where k is a constant, $X_{unknown}$ is the unknown analog value being measured, and $X_{offset}$ is the offset value. $X_{offset}$ the offset value may or may not be equal to a reference value.

22 Claims, 2 Drawing Sheets

5,633,639

SUCCESSIVE APPROXIMATION ANALOG TO DIGITAL CONVERTER WITH AUTOMATIC OFFSET

CROSS REFERENCE TO RELATED APPLICATIONS

The subject matter of the present application is related to copending U.S. application, titled "Ratiometric Analog to Digital Converter with Automatic Offset", Docket No.: 94-L-89, filed Nov. 30, 1994, U.S. Ser. No. 08/346,903, which assigned to the assignee hereof and is herein incorporated by reference.

BACKGROUND OF THE INVENTION

The present invention relates generally to measurement technology, and more specifically to measurement accomplished by successive approximation analog to digital converter technology.

There exists a great number and variety of applications where it is desired to measure a value, such as resistance, voltage, or current, with a fixed resolution. Analog to digital converters (A/D converters) are often used to measure an actual value, analog in form, and then to convert this measurement to a digital value. Successive approximation A/D converters are often used for such applications and provide the advantage of providing a very fast conversion for applications having low resolution, usually 8 bits or lower.

As mentioned above, a standard successive approximation A/D converter may be used to measure an unknown analog value, such as resistance, voltage, or current, and then convert the measured analog value to a digital value. Typically, the unknown analog value is measured with a resolution that is higher than the required resolution and then an offset value is subtracted from the unknown analog value and the result rounded off to the desired resolution. Suppose that 8 bits of resolution is desired. The measurement must be made with a higher resolution than 8 bits, such as 9 bits or 10 bits of resolution, and the measurement result, after subtraction of an offset value from the unknown analog value, must be rounded off to 8 bits of resolution. For instance, if a value between 2 volts and 4 volts is to be measured with 8 bits of accuracy equal to $2^8$ or 256 bits, then 9 bits of resolution, $2^9$ or 512 bits, must be used to make the actual measurement. Furthermore, if a value between 4 volts and 6 volts is to be measured with 8 bits of accuracy, then 10 bits of resolution equal to $2^{10}$ or 1024 bits must be used to make the actual measurement. After the measurement has been made with a higher degree of resolution than the desired resolution and after subtraction of an offset value from the unknown analog value, then the result is rounded off to the desired resolution, in this case 8 bits resolution.

This type of conversion requires an A/D converter, such as a standard successive approximation A/D converter, with a resolution and accuracy higher than the required resolution and some logic to perform the subtraction. FIG. 1 shows the operation of a typical multiplying digital to analog converter (DAC) portion, similar to the MC 1408, of a standard successive approximation A/D converter. The DAC 10 represents the digital to analog converter portion of a standard successive approximation A/D converter for an 8 bit conversion resolution and comprises a series of eight current sources I0 through I7 represented by In, a series of switches K0 to K7 corresponding to the current sources, and a resistor R0 connected in parallel across Op Amp, an operational amplifier. Current sources I0 to I7 are binarily weighted current sources; thus for this eight bit example, current source I0 is equal to the total current I divided by $2^8$ (or 256) while current source I7 is equal to the total current I divided by $2^1$ (or 2). Each current source In is connected to a corresponding switch Kn and the current source is electrically connected to input signal 12 of Op Amp only when its switch Kn is closed or equal to "1" as shown in FIG. 1; if switch Kn is open or equal to "0" then current source In is not connected to input signal 12 of Op Amp. In addition to input signal 12, Op Amp has a second input signal 14 which is tied to ground potential as shown.

The Op Amp and resistor R0 in parallel with Op Amp operate to effect a current to voltage conversion such that Output signal 16 of Op Amp is an output voltage. Output voltage signal 16 is set by the digital byte that controls the switches, K0–K7, such that the Output voltage signal 16, V0, is given by the equation:

$$V0 = R0 * \Sigma In * Kn, \qquad (1)$$

where In is the current source selected equal to $I/2^{(8-n)}$ where I is the total current generated by DAC 10, and Kn is its corresponding switch, Kn, which is either open ("0") or closed ("1").

When the DAC of FIG. 1 is used with a standard successive approximation register, like the MC14549, each switch is closed in sequence, starting with the most significant bit (MSB), and a voltage comparator will leave the switch closed if the resulting output voltage is less than the voltage being measured. On each subsequent cycle the next lower significant bit is closed and the cycle repeats until all 8 (or however many bits of resolution are used) have been completed. The resultant value in the successive approximation register is then the digital representation of the unknown voltage being measured.

While the above implementation of a DAC portion of a standard successive approximation A/D converter does serve to convert a raw analog measurement to a corresponding raw digital value, it does not produce a digital value that is offset with respect to a given measurement range. It is desirable to have a digital value after the conversion is complete that contains an offset, so that a digital value of 0 indicates not a value of 0 Ohms, 0 volts, or 0 Amps, but rather the minimum value of a given range of values. In the above example of measuring voltage between 2 volts and 4 volts, for example, it would be desirable to have a converted digital value of 0 which is representative of the bottom of the measurement range or 2 volts. This may be expressed in equation form where the desired conversion value is represented by:

$$k(X_{unknown} - X_{offset}) \qquad (2)$$

where k is a constant, $X_{unknown}$ is the unknown analog value being measured, and $X_{offset}$ is the offset value.

SUMMARY OF THE INVENTION

It would be advantageous in the art to utilize successive approximation analog to digital converter technology that measures an analog value and in turn produces a digital value that is automatically offset with respect to a given measurement range.

Therefore, according to the present invention, a modification of standard successive approximation analog to digital converter circuitry may be utilized to measure an unknown analog value and to produce a digital value after conversion that automatically contains an offset value with respect to a given measurement range. The offset achieved by the successive approximation A/D converter is proportional to an external reference which is also used as the reference for the successive approximation A/D converter. The digital value produced according to the present invention is not representative of a raw measurement value but rather is representative of a value with respect to a given measurement range; thus, a digital value of 0 may indicate the minimum value of a given measurement range rather than a value of 0 Ohms, 0 volts, or 0 Amps. This may be expressed in equation form where the desired conversion value is represented by:

$$k(X_{unknown} - X_{offset})$$

where k is a constant, $X_{unknown}$ is the unknown analog value being measured, and $X_{offset}$ is the offset value. $X_{offset}$ the offset value may or may not be equal to a reference value.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

A modification of a standard successive approximation A/D converter that achieves an offset proportional to an external reference and uses the external reference as the reference for the A/D.

Figure 1:
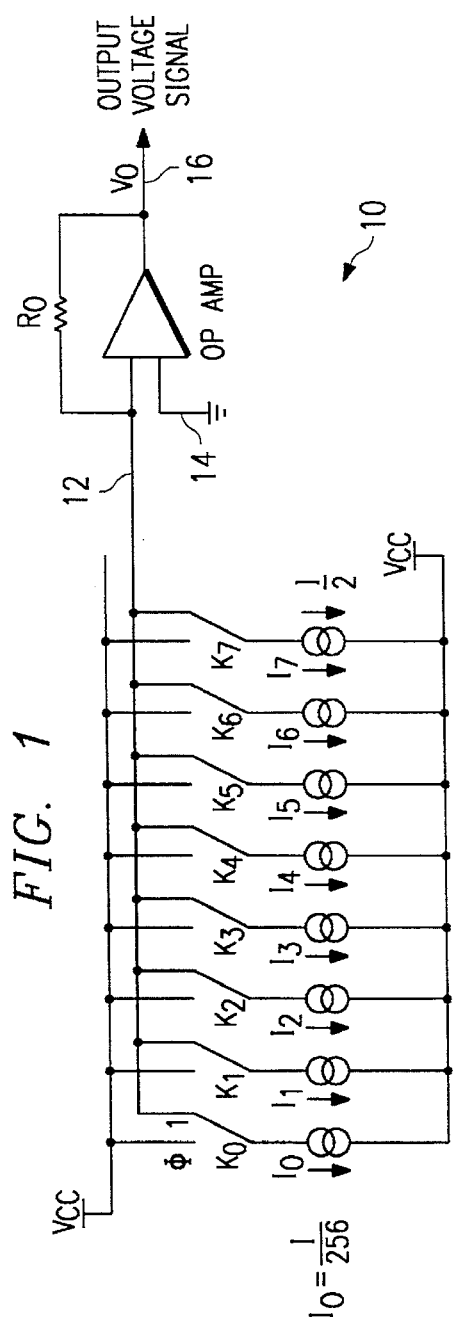
FIG. 1 is a schematic diagram of a digital to analog converter (DAC) portion of a standard successive approximation analog to digital (A/D) converter.

According to the present invention, a modification of standard successive approximation analog to digital converter circuitry of the type shown in FIG. 1 may be utilized to measure an unknown analog value and to produce a digital value after conversion that automatically contains an offset value with respect to a given measurement range. The offset achieved by the successive approximation A/D converter is proportional to an external reference which is also used as the reference for the successive approximation A/D converter. The digital value produced according to the present invention is not representative of a raw measurement value but rather is representative of a value with respect to a given measurement range; thus, a digital value of 0 may indicate the minimum value of a given measurement range rather than a value of 0 Ohms, 0 volts, or 0 Amps. This may be expressed in equation form where the desired conversion value is represented by:

$$k(X_{unknown} - X_{offset}) \quad (3)$$

where k is a constant, $X_{unknown}$ is the unknown analog value being measured, and $X_{offset}$ is the offset value. $X_{offset}$ the offset value may or may not be equal to a reference value.

The offset achieved by the successive approximation A/D converter is proportional to an external reference which is also used as the reference for the successive approximation A/D converter. In this way, the offset is subtracted from the measured value during the conversion and no additional arithmetic function is required. This implementation of the invention requires only modifying the DAC portion of a standard successive approximation A/D converter so that the output voltage of multiplying DAC of the A/D converter is equal to the offset value when all switches of the multiplying DAC are open, and requires very little additional logic.

Figure 2:
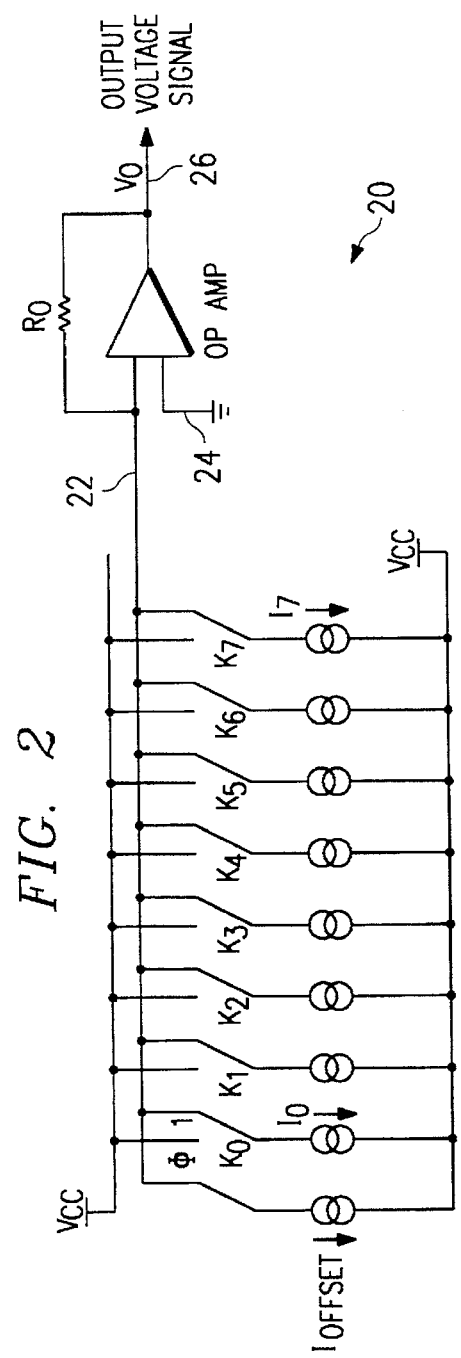
FIG. 2 is a schematic diagram of a modified digital to analog converter (DAC) portion of a standard successive approximation analog to digital (A/D) converter.

FIG. 2 shows a modified successive approximation multiplying DAC 20 that can be used with the same successive approximation register (SAR) such as the MC 14549 to comprise a successive approximation A/D converter. The DAC 20 represents the digital to analog converter portion of a standard successive approximation A/D converter for an 8 bit conversion and is similar to DAC 10 of FIG. 1, except that DAC 20 incorporates an offset in the conversion so that if all switches K0–K7 are 0, then the output voltage is equal to the offset. DAC 20 of FIG. 2 comprises a series of nine current sources, Ioffset and I0 through I7, where I0 to I7 are represented by In, a series of switches K0 to K7 corresponding to the current sources, and a resistor R0 connected in parallel across Op Amp, an operational amplifier.

Current source Ioffset is an offset current source, and current sources I0 to I7 are binarily weighted current sources; thus for this eight bit example, current source I0 is equal to the total current I divided by $2^8$ (or 256) while current source I7 is equal to the total current I divided by $2^1$ (or 2). Each current source In is connected to a corresponding switch Kn and the current source is electrically connected to input signal 22 of Op Amp only when its switch Kn is closed or equal to "1" as shown in FIG. 1; if switch Kn is open or equal to "0" then current source In is not connected to input signal 22 of Op Amp. Ioffset does not have any corresponding switch and thus is always connected to input signal 22 of the Op Amp. In addition to input signal 22, Op Amp has a second input signal 22 which is tied to ground potential as shown.

The Op Amp and resistor R0 in parallel with Op Amp operate to effect a current to voltage conversion such that Output signal 26 of Op Amp is an output voltage. DAC 20 incorporates an offset, represented by Ioffset, in the conversion so that if all switches K0–K7 are set to an open position ("0"), then the Output voltage signal 26 is equal to the offset. In this configuration, the Output voltage signal 26, V0, is given by the equation:

$$V0 = R0 * (I_{offset} + \Sigma In * Kn) \quad (4)$$

if $I_{offset} = Y1 * Vref$ and $In = Y2 * Vref/2^{(8-n)}$, where Y1 and Y2 are constants defined by the gain of DAC 10, then the output voltage V0 of equation 4 can be rewritten as:

$$V0 = R0 * (Y1 * Vref + Y2 * Vref * \Sigma Kn/2^{(8-n)}) \quad (5)$$

In this way a result value of 0 is actually equal to the offset value so that the offset is automatically subtracted from the conversion. Using this transfer for the A/D portion of the successive approximation A/D produces a result such that the result in the SAR is given by the equation:

$$Result = Y1(Vunknown) - Y2(Voffset), \quad (6)$$

where Y1 and Y2 are constants defined by the gain of the A/D converter.

DAC 20 of FIG. 2 is representative of a DAC which has been modified through the addition of an offset current Ioffset to yield an offset in Output voltage signal 26. One skilled in the art will understand the use of an additional offset current to yield an offset in the output voltage of a DAC, which in turn will yield an offset in the output signal of a successive approximation A/D converter which utilizes such a DAC.

Figure 3:
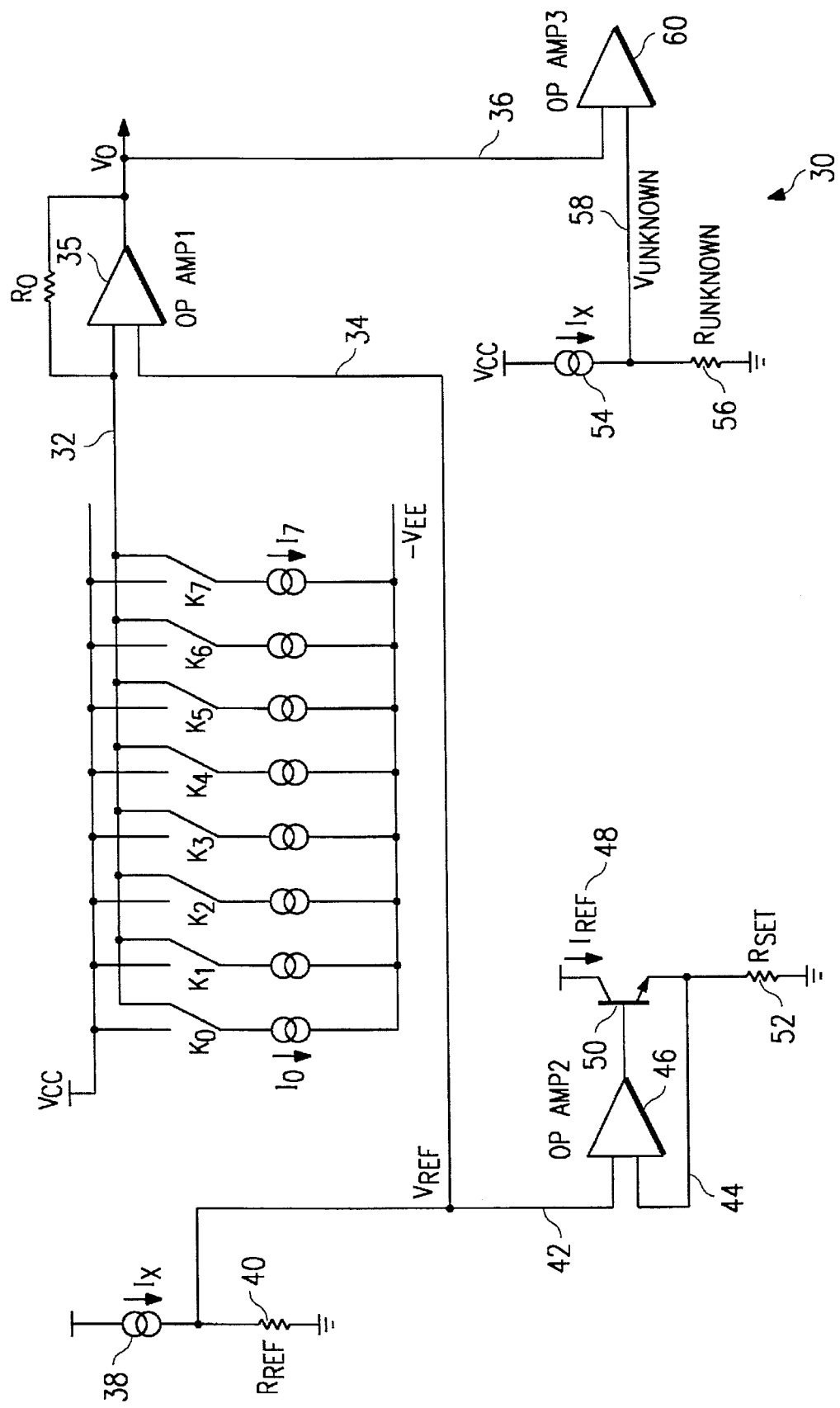
FIG. 3 is a schematic diagram of a modified digital to analog converter (DAC) portion of a standard successive approximation analog to digital (A/D) converter, according to a first preferred embodiment of the present invention.

FIG. 3 builds upon the offset idea shown in DAC 20 of FIG. 2 in order to measure an unknown resistance, according to a preferred embodiment of the present invention. FIG. 3 shows the operation of a typical multiplying digital to analog converter (DAC) 30 portion, similar to the MC 1408, of a standard successive approximation A/D converter. DAC 30 represents the digital to analog converter portion of a standard successive approximation A/D converter for an 8 bit conversion resolution and comprises a series of eight current sources I0 through I7 represented by In, a series of switches K0 to K7 corresponding to the current sources, a resistor R0 connected in parallel across Op Amp1 35, an operational amplifier, current source 38, reference resistance Rref 40, Op Amp2 46, reference current source Iref 48, transistor 50, set resistor Rset, current source 54, unknown resistor Runknown 56, and Op Amp3 60.

Current sources I0 to I7 are binarily weighted current sources; thus for this eight bit example, current source I0 is equal to the total current I divided by $2^8$ (or 256) while current source I7 is equal to the total current I divided by $2^1$ (or 2). Each current source In is connected to a corresponding switch Kn and the current source is electrically connected to input signal 32 of Op Amp1 35 only when its switch Kn is closed or equal to "1" as shown in FIG. 1; if switch Kn is open or equal to "0" then current source In is not connected to input signal 32 of Op Amp1 35. In addition to input signal 32, Op Amp1 35 has a second input signal 34 which is equal to voltage Vref as defined by node 42; thus input signal 34 is equal to Vref which is determined by the voltage divider comprised of current source 38 and reference resistance Rref 40.

Op Amp1 35 and resistor R0 in parallel with it operate to effect a current to voltage conversion such that Output voltage signal 36 of Op Amp1 35 is an output voltage. Output voltage signal 36 is a first input signal to Op Amp3 60 and a second voltage input signal Vunknown 58 to Op Amp3 60 is provided by the voltage divider comprised of current source 54 and unknown resistor Runknown 56. In this configuration, used with a standard SAR to render a standard successive approximation A/D converter, the reference resistance Rref 40 and the unknown resistance Runknown 56 are biased by matching current sources 38 and 54.

Matched current sources 38 and 54, represented as Ix, can easily be achieved in a silicon implementation with better than 0.4% precision required for 8 bit results even though the absolute value of the current can only be controlled to within +/−20%. Vref, the voltage developed across the reference resistance at node 42 is used to determine the bias for DAC 30 of the successive approximation A/D converter. Again the output of the A/D converter is offset, however in this configuration it is offset by biasing the output current to voltage converter directly from the reference voltage. The internal resistance Rset and R0 can be matched within the required precision. The use of matched current sources is critical so that ratioed equations may be developed for defining the value of an unknown resistance, as shown in the following equations:

$$Iref = Vref/Rset \quad (7)$$

$$Vref = Ix*Rref = Iref*Rset \quad (8)$$

$$In = Iref/2^{(8-n)} \quad (9)$$

$$Vunknown = Ix*Runknown \quad (10)$$

In light of equations 7 to 10, Output voltage V0 is defined as follows:

$$V0 = Vref + R0*(\Sigma Iref/2^{(8-n)} - Kn) \quad (11)$$

$$V0 = Ix*Rref + Iref*(\Sigma Kn/2^{(8-n)})*R0 \quad (12)$$

$$V0 = Ix*Rref + Ix*Rref/Rset*(\Sigma Kn/2^{(8-n)})*R0 \quad (13)$$

And because V0 equals Vunknown:

$$Ix*Runknown = Ix*Rref + Ix*Rref/Rset*(\Sigma Kn/2^{(8-n)})*R0 \quad (14)$$

Thus equation 14 is rearranged and Runknown is defined as:

$$Runknown = Rref*(1 + Y*\Sigma Kn/2^{(8-n)}), \quad (15)$$

where Y is a constant defined by the gain of DAC 30 which is equal to: Y=R0/Rset.

Although the foregoing discussion with regard to the present invention discusses measuring resistance, it is clear that the present invention may also be used to measure voltage or current as well, since resistance, current, and voltage are all related by Ohm's law.

While the invention has been particularly shown and described with reference to a preferred embodiment, it will be understood by those skilled in the art that various changes in form and detail may be made therein without departing from the spirit and scope of the invention.

What is claimed is:

1. A method for converting an analog value to a digital value with an offset having a given degree of accuracy using a successive approximation analog to digital converter, comprising the steps of:

measuring an analog value;

converting the analog value to a digital value using a successive approximation analog to digital converter; and subtracting an offset value from the analog value to generate a digital conversion result representative of the analog value with respect to a measurement range, having a minimum value and a maximum value, wherein the offset value achieved by the successive approximation A/D converter is proportional to an external reference value.

2. The method of claim 1, wherein the external reference value is a reference for the successive approximation converter.

3. The method of claim 1, wherein the digital conversion result is equal to $k(X_{unknown} - X_{offset})$, where k is a constant, $X_{unknown}$ is the analog value being measured, and $X_{offset}$ is the offset value.

4. The method of claim 3, wherein the analog value being measured is a voltage value.

5. The method of claim 4, wherein a multiplying digital to analog portion of the analog to digital converter is comprised of the following elements:

a plurality of n binarily weighted current sources connected to a supply voltage and connected in parallel to each other, where n represents the resolution in bits of the successive approximation A/D converter;

a plurality of n switches, with each binarily weighted current sources of the plurality of n binarily weighted current sources connected to a corresponding switch of the plurality of n switches, where n represents the resolution in bits of the successive approximation A/D converter and wherein when the corresponding switch is closed a corresponding binarily weighted current source of the plurality of binarily weighted current sources is connected to the supply voltage;

an offset current source representative of the offset value which is connected in parallel to the plurality of binarily weighted current sources and which is connected across the supply voltage;

an operational amplifier having a current input signal and a voltage output signal, wherein the current input signal is equal to the offset value produced by the offset current source and a current produced by those binarily weighted current sources of the plurality of binarily weighted current sources whose corresponding switch is closed; and a resistive element connected in parallel to the operational amplifier, wherein the operational amplifier and the resistive element operate to convert the current input signal to the voltage output signal.

6. The method of claim 5, wherein if each switch of the plurality of switches are set to an open position, the voltage output signal of the operational amplifier is equal to the offset value.

7. The method of claim 5, wherein the voltage output signal of the operational amplifier is designated as V0 and V0 is equal to the following equation:

$$V0=R0*(I_{offset}+\Sigma In*Kn)$$

where R0 represents the resistive element, Ioffset represents the offset value of the offset current source and $\Sigma$ In*Kn represents the summation of the plurality of binarily weighted current sources multiplied by the plurality of switches, where n represents the resolution in bits of the successive approximation A/D converter.

8. The method of claim 3, wherein the analog value being measured is a resistance value.

9. A method for converting an analog value to a digital value with an offset having a given degree of accuracy using a successive approximation analog to digital converter, comprising the steps of:

measuring an analog value, wherein the analog value being measured is a resistance value;

converting the analog value to a digital value using a successive approximation analog to digital converter, wherein a multiplying digital to analog portion of the analog to digital converter is comprised of the following elements:

a plurality of n binarily weighted current sources connected to a first supply voltage and connected in parallel to each other, where n represents the resolution in bits of the successive approximation A/D converter;

a plurality of n switches, with each binarily weighted current source of the plurality of n binarily weighted current sources connected to a corresponding switch of the plurality of n switches, where n represents the resolution in bits of the successive approximation A/D converter and wherein when the corresponding switch is closed a corresponding binarily weighted current source of the plurality of binarily weighted current sources is connected to the supply voltage;

a first operational amplifier having a current input signal, a reference input signal, and a voltage output signal;

a first current source and a second current source, wherein the first current source and the second current source are matched and each are connected to the first supply voltage;

a first resistive element connected in parallel to the first operational amplifier, wherein the first operational amplifier and the first resistive element operate to convert the current input signal to the voltage output signal;

a second resistive element connected to the first current source and a second supply voltage;

a third resistive element connected to the second supply voltage;

a fourth resistive element connected to the second supply voltage;

a second operational amplifier having a first input signal equal to a first node defined by the connection of the first current source, the second resistive element, and the reference input signal of the first operational amplifier; a second input signal connected to the third resistive element and a emitter of a transistor, wherein the transistor is connected to the first supply voltage; and a third operational amplifier having a first input signal equal to the voltage output signal of the first operational amplifier, and a second input signal equal to a second node defined as the connection of the second current source and the fourth resistive element; and subtracting an offset value from the analog value to generate a digital conversion result representative of the analog value with respect to a measurement range, having a minimum value and a maximum value, wherein the offset value achieved by the successive approximation A/D converter is proportional to an external reference value and wherein the digital conversion result is equal to $k(X_{unknown}-X_{offset})$, where k is a constant, $X_{known}$ is the analog value being measured, and $X_{offset}$ is the offset value.

10. The method of claim 9, wherein the unknown analog value is equal to the value of the fourth resistive element which is designated as Runknown and Runknown is equal to the following equation:

$$Runknown=Rref*(1+Y*\Sigma Kn/2^{(8-n)}),$$

where Y is a constant defined by a gain parameter of the successive approximation analog to digital converter equal to: Y=R0/Rset, where Rref represents the second resistive element, R0 represents the first resistive element, Rset represents the third resistive element, $\Sigma Kn/2^{(8-n)}$ represents the summation of the plurality of switches divided by the binary weight being measured.

11. A successive approximation analog to digital converter which converts an analog value to a digital value with an offset having a given degree of accuracy, comprising:

a successive approximation analog to digital converter capable of measuring an analog value, converting the analog value to a digital value, and subtracting an offset value from the analog value to generate a digital conversion result representative of the analog value with respect to a measurement range, having a minimum value and a maximum value, a multiplying digital to analog portion of the analog to digital converter comprised of the following elements:

a plurality of n binarily weighted current sources connected to a supply voltage and connected in parallel to each other, where n represents the resolution in bits of the successive approximation A/D converter;

a plurality of n switches, with each binarily weighted current sources of the plurality of n binarily weighted current sources connected to a corresponding switch of the plurality of n switches, where n represents the resolution in bits of the successive approximation A/D converter and wherein when the corresponding switch is closed a corresponding binarily weighted current source of the plurality of binarily weighted current sources is connected to the supply voltage;

an offset current source representative of the offset value which is connected in parallel to the plurality of binarily weighted current sources and which is connected across the supply voltage;

an operational amplifier having a current input signal and a voltage output signal, wherein the current input signal is equal to the offset value produced by the offset current source and a current produced by those binarily weighted current sources of the plurality of binarily weighted current sources whose corresponding switch is closed; and a resistive element connected in parallel to the operational amplifier, wherein the operational amplifier and the resistive element operate to convert the current input signal to the voltage output signal.

12. The successive approximation analog to digital converter of claim 11, wherein the digital conversion result is equal to $k(X_{unknown}-X_{offset})$, where k is a constant, $X_{unknown}$ is the analog value being measured, and $X_{offset}$ is the offset value.

13. The successive approximation analog to digital converter of claim 11, wherein if each switch of the plurality of switches are set to an open position, the voltage output signal of the operational amplifier is equal to the offset value.

14. The successive approximation analog to digital converter of claim 11, wherein the external reference value is a reference for the successive approximation converter.

15. The successive approximation analog to digital converter of claim 11, wherein the analog value being measured is a voltage value.

16. The successive approximation analog to digital converter of claim 15, wherein if each switch of the plurality of switches are set to an open position, the voltage output signal of the operational amplifier is equal to the offset value.

17. The successive approximation analog to digital converter of claim 15, wherein the voltage output signal of the operational amplifier is designated as V0 and V0 is equal to the following equation:

$$V0=R0*(I_{offset}+\Sigma In*Kn)$$

where R0 represents the resistive element, Ioffset represents the offset value of the offset current source and $\Sigma In * Kn$ represents the summation of the plurality of binarily weighted current sources multiplied by the plurality of switches, where n represents the resolution in bits of the successive approximation A/D converter.

18. A successive approximation analog to digital converter which converts an analog value to a digital value with an offset having a given degree of accuracy, comprising:

a successive approximation analog to digital converter capable of measuring an analog value, converting the analog value to a digital value, and subtracting an offset value from the analog value to generate a digital conversion result representative of the analog value with respect to a measurement range, having a minimum value and a maximum value, a multiplying digital to analog portion of the analog to digital converter comprised of the following elements:

a plurality of n binarily weighted current sources connected to a first supply voltage and connected in parallel to each other, where n represents the resolution in bits of the successive approximation A/D converter;

a plurality of n switches, with each binarily weighted current sources of the plurality of n binarily weighted current sources connected to a corresponding switch of the plurality of n switches, where n represents the resolution in bits of the successive approximation A/D converter and wherein when the corresponding switch is closed a corresponding binarily weighted current source of the plurality of binarily weighted current sources is connected to the supply voltage;

a first operational amplifier having a current input signal, a reference input signal, and a voltage output signal;

a first current source and a second current source, wherein the first current source and the second current source are matched and each are connected to he first supply voltage;

a first resistive element connected in parallel to the first operational amplifier, wherein the first operational amplifier and the first resistive element operate to convert the current input signal to the voltage output signal;

a second resistive element connected to the first current source and a second supply voltage;

a third resistive element connected to the second supply voltage;

a fourth resistive element connected to the second supply voltage;

a second operational amplifier having a first input signal equal to a first node defined by the connection of the first current source, the second resistive element, and the reference input signal of the first operational amplifier; a second input signal connected to the third resistive element and a emitter of a transistor, wherein the transistor is connected to the first supply voltage; and a third operational amplifier having a first input signal equal to the voltage output signal of the first operational amplifier, and a second input signal equal to a second node defined as the connection of the second current source and the fourth resistive element.

19. The successive approximation analog to digital converter of claim 18, wherein the analog value being measured is a resistance value.

20. The successive approximation analog to digital converter of claim 19, wherein the unknown analog value is equal to the value of the fourth resistive element which is designated as Runknown and Runknown is equal to the following equation:

$$Runknown=Rref*(1+Y*\Sigma Kn/2^{(8-n)}),$$

where Y is a constant defined by a gain parameter of the successive approximation analog to digital converter equal to: Y=R0/Rset, where Rref represents the second resistive element, R0 represents the first resistive element, Rset represents the third resistive element, $\Sigma Kn/2^{(8-n)}$ represents the summation of the plurality of switches divided by the binary weight being measured.

21. The successive approximation analog to digital converter of claim 18, wherein the external reference value is a reference for the successive approximation converter.

22. The successive approximation analog to digital converter of claim 18, wherein the digital conversion result is equal to $k(X_{unknown}-X_{offset})$, where k is a constant, $X_{unknown}$ is the analog value being measured, and $X_{offset}$ is the offset value.

* * * * *